United States Patent
Magrath et al.

(10) Patent No.: US 7,348,840 B2
(45) Date of Patent: Mar. 25, 2008

(54) FEEDBACK CONTROLLER FOR PWM AMPLIFIER

(75) Inventors: Anthony James Magrath, Edinburgh (GB); John Westlake, Hong Kong (CN)

(73) Assignee: Wolfson Microelectronics plc, Edinburgh (GB)

(*) Notice: Subject to any disclaimer, the term of this patent is extended or adjusted under 35 U.S.C. 154(b) by 191 days.

(21) Appl. No.: 11/225,845

(22) Filed: Sep. 14, 2005

(65) Prior Publication Data

US 2007/0040608 A1    Feb. 22, 2007

(30) Foreign Application Priority Data

Aug. 17, 2005  (GB) ................... 0516823.2

(51) Int. Cl.
    *H03F 3/38* (2006.01)
(52) U.S. Cl. .............. 330/10; 330/251; 330/207 A
(58) Field of Classification Search .......... 330/10, 330/251, 207 A
    See application file for complete search history.

(56) References Cited

U.S. PATENT DOCUMENTS

| | | | |
|---|---|---|---|
| 4,249,136 A | 2/1981 | Suzuki et al. | |
| 4,523,152 A | 6/1985 | Garde | |
| 5,077,540 A | 12/1991 | Keith et al. | |
| 5,389,829 A | 2/1995 | Milazzo | |
| 5,506,532 A | 4/1996 | Milazzo | |
| 5,917,369 A | 6/1999 | Nguyen | |
| 5,939,924 A | 8/1999 | Visocchi et al. | |
| 6,140,875 A * | 10/2000 | Van Den Homberg et al. | 330/251 |
| 6,339,360 B1 | 1/2002 | Santillano | |
| 6,768,779 B1 * | 7/2004 | Nielsen | 375/297 |
| 6,922,100 B2 * | 7/2005 | Midya et al. | 330/10 |
| 2002/0097090 A1 | 7/2002 | Smedegaard-Pedersen et al. | |
| 2004/0125968 A1 * | 7/2004 | Pearce et al. | 381/120 |

(Continued)

FOREIGN PATENT DOCUMENTS

DE    197 41 794    3/1999

(Continued)

OTHER PUBLICATIONS

U.S. Appl. No. 11/110,858, filed Apr. 21, 2005, Magrath.

(Continued)

*Primary Examiner*—Patricia Nguyen
(74) *Attorney, Agent, or Firm*—Dickstein Shapiro LLP

(57) ABSTRACT

A feedback controller in a PWM amplifier comprises a signal input for receiving a pulse width modulated (PWM) input signal (Vin) whose duty cycle represents a desired analogue output signal. A feedback loop filter 518 generates a filtered error signal (Vint) comprising a filtered representation of differences between the input signal (Vin) and a feedback signal (Vfb). A comparator (520) compares the filtered error signal with a reference to generate a provisional PWM switching control signal (C) for controlling the PWM amplifier (500). A pulse conditioner (532) receives both the provisional PWM switching control signal (C) and the PWM input signal (X=Vin) and outputs to the amplifier (500) a conditioned PWM switching control signal (Y), modified in accordance with predetermined constraints in relation to the PWM input signal. The pulse conditioner includes a single pulse function (534) whereby only a single pulse is permitted for every pulse in the input signal, thereby eliminating oscillations that can otherwise Occur under over-voltage supply conditions. Missing pulse and minimum pulse width functions (536, 538) can also be provided.

30 Claims, 12 Drawing Sheets

U.S. PATENT DOCUMENTS

| | | |
|---|---|---|
| 2004/0232978 A1 | 11/2004 | Easson et al. |
| 2005/0017799 A1 | 1/2005 | Risbo et al. |
| 2005/0024133 A1 | 2/2005 | Midya et al. |
| 2005/0058209 A1 | 3/2005 | Magrath |

FOREIGN PATENT DOCUMENTS

| | | |
|---|---|---|
| WO | WO 01/22585 | 3/2001 |
| WO | WO 02/087076 | 10/2002 |
| WO | WO 2004/049561 | 6/2004 |

OTHER PUBLICATIONS

"Comments on Design Parameters Inportant for the Optimization of Very High-Fidelity PWM (Class D) Audio Amplifiers" J Audio Eng Soc vol. 33 No. 10 Oct. 1985 Letter by Vanderkooy.

Search Report for Application No. GB 0516823.2, Nov. 23, 2005.

* cited by examiner

FEEDBACK CONTROLLER FOR PWM AMPLIFIER

PRIOR APPLICATION DATA

The present application claims priority from United Kingdom application 0516823.2, filed on Aug. 17, 2005, the disclosure of which is incorporated herein by reference in its entirety.

FIELD OF THE INVENTION

The invention relates to a feedback controller for use in a pulse width modulated (PWM) amplifier, and to an amplifier circuit including such a controller. The invention further relates to a method of controlling a PWM amplifier.

BACKGROUND

PWM techniques have recently started to become prevalent in hi-fi audio, to give "Class D" or "switching" output stages. PWM power amplifiers also find application in a range of applications including motor control.

The high efficiency offered by these techniques minimises driver power dissipated in the driver transistors, so small and simple cheap packages can be used even for 100 W power amplifiers, rather than expensive special low-thermal-resistance packages. Savings in system cost and a smaller physical size result from the reduced need for heat-sinking. There are similar savings in cost and size from the reduced current rating required from the system power supply.

The higher acceptable package thermal resistance also tenders it practicable to use standard high-pin-count packages, for output power up to say 10 W, allowing other digital or small-signal analogue functions to be implemented on the same integrated circuit, thus reducing overall system cost weight and physical volume and improving reliability.

One problem with using a simple output stage is that, for a given input PWM duty-cycle, the output amplitude is directly proportional to the power supply voltage. Thus any ripple on the power supply will inter-modulate with the applied audio signal. Similarly, any signal-dependent ripple on the power supply will generate harmonics. Also the output driver stage will not be an ideal switch: the output transistors and pre-drivers will have finite and variable switch-on and switch-off times. Also there may be periods when inductive fly-back causes current to flow in output clamp diodes with non-linear and variable characteristics.

U.S. Pat. No. 4,249,136 (Suzuki et al) discloses an arrangement in which feedback is applied around the PWM amplifier, to suppress these modulation effects. The input signal is a 2-level PWM signal, which is compared to an attenuated version of the PWM output signal produced by the power-switch. The resulting error signal is filtered by an integrating loop filter which has a high gain in the audio signal frequency range but rejects higher frequencies, and compared to a zero voltage reference. The output of the comparator is used to control the power switch, which comprises a pair of power transistors. In this way, the output amplitude is now substantially defined only by the amplitude (and duty cycle modulation) of the PWM waveform applied to Vin, and becomes largely independent of power supply voltage.

However, deeper evaluation and practical experience reveals that this circuit only operates satisfactorily over a limited range of supply voltage, which constrains the accuracy requirement for the system power supply. Moreover, especially for low-cost applications, the power supply is likely to have poor load regulation at d.c. and even poorer load regulation at high audio frequencies. As the supply voltage falls due to load-current demands, the feedback causes the output pulse-width to increase to compensate to maintain the output audio-frequency signal amplitude. If the modulation index is high, the peaks of the values of the widths of the pulses can increase to the extent that adjacent output pulses collide with each other, causing a reducing in pulse-repetition frequency (PRF). This is a problem because it introduces lower-frequency carrier components which will not be adequately attenuated by the output filter and will generate objectionable non-harmonic audible distortion.

Also Class D amplifiers can suffer from an effect called 'supply pumping', where the supply voltage can increase as well as decrease, due to current being fed back into the supply from the output inductor during decreasing signals, as the inductor returns energy to the supply. The supply voltage may also rise if current demand suddenly falls, due to the output inductance or low load regulation bandwidth of the power supply.

As also discussed in U.S. Pat. No. 6,140,875, a PWM amplifier with feedback control can exhibit high-frequency oscillations under these conditions. These high-frequency oscillations will disrupt the feedback loop, giving possibly gross audible distortion. They may also impair the efficiency of the output stage, possibly causing overheating or even destruction of the output stage. The only solution proposed in U.S. '875 is to keep the input modulation depth low, and configure the amplifier to have additional gain to compensate, but this limits the performance of the amplifier under normal conditions.

SUMMARY OF THE INVENTION

The invention aims to enable the provision of a PWM amplifier with feedback control loop which is more robust against variations in power supply voltage. Particular wishes are to avoid unnecessary high-frequency activity and to eliminate spurious low-frequency output signal components.

In the proposed invention, these problems are solved by the introduction of Pulse-constraint Logic, which ensures that for every input pulse, there is only one output pulse. This is believed to be a novel enhancement to the architecture.

The invention provides a feedback controller for a PWM amplifier, the controller comprising:
  a signal input for receiving a pulse width modulated (PWM) input signal whose duty cycle represents a desired analogue output signal;
  a feedback input for receiving a feedback signal representing an actual PWM output signal of the amplifier;
  means for generating a filtered error signal comprising a filtered representation of differences between the input signal and the feedback signal;
  means for comparing the filtered error signal with a reference to generate a provisional PWM switching control signal for controlling the PWM amplifier; and
  a pulse conditioner arranged to receive both the provisional PWM switching control signal and the PWM input signal for outputting to the amplifier a conditioned PWM switching control signal comprising the provisional PWM switching control signal modified in accordance with predetermined constraints in relation to the PWM input signal.

The pulse conditioner may be arranged to inhibit a transition in the switching control signal under conditions defined by reference to past transitions in the PWM input signal. Depending on the further evolution of the PWM input signal and the provisional switching control signal, the transition in said provisional switching control signal which is inhibited by said pulse conditioner may be either eliminated altogether in said conditioned control signal or reproduced subsequently in response to a transition in the input signal.

In a preferred embodiment, the pulse conditioner implements a "single pulse" function whereby it is ensured that for every input pulse, there is only one output pulse. This function eliminates the oscillations mentioned above.

The pulse conditioner may comprise a logic circuit having as inputs the PWM input signal and the provisional control signal.

The logic circuit is preferably constructed such that, subject to constraints based on the PWM input signal, the conditioned control signal responds asynchronously to transitions in the provisional control signal. This ensures the accuracy of timing in the conditioned signal, particularly under normal conditions when no modifications are applied. Alternatively, the asynchronous behaviour mentioned above could be approximated by sequential circuits with a sufficiently high clock rate.

The logic circuit may further comprise a clock input for a clock signal having a frequency many times the pulse repetition frequency of said PWM input signal.

The pulse conditioner may be formed such that the conditioned PWM switching signal will be identical to the provisional PWM switching control signal for as long as supply voltages to the amplifier and modulation depth in the PWM input signal remain within predetermined operating limits.

The pulse conditioner may further comprise a "missing pulse" function for generating additional pulses in the conditioned control signal in the event that an interval between pulses in the provisional control signal exceeds a predetermined value. This maintains a minimum pulse frequency even when low voltage and/or other conditions cause pulses in the provisional control signal to collide and merge.

The missing pulse function may be applied after the single pulse function. In the event that the excessive interval is caused within the pulse conditioner, the minimum frequency constraint can still be met.

The pulse conditioner may further include a "minimum pulse" function for imposing a minimum duration on pulses in the conditioned control signal.

The minimum pulse function may be applied after the single pulse function, and optionally after the missing pulse function also. The minimum pulse and missing pulse function can be combined in one circuit if desired.

The names given to the three functions mentioned above are not to be taken as limiting the scope of protection beyond the properties specifically ascribed to those functions. The various functions mentioned can conveniently be implemented by a mixture of analogue and logic circuitry, including combinational and sequential logic. The same functions or a part of them could in principle be implemented under control of a stored program in a microcontroller, although that would not currently be a preferred option for a high-quality audio amplifier.

The invention further provides a feedback controller for a PWM amplifier, the controller comprising:

a signal input for receiving a pulse width modulated (PWM) input signal whose duty cycle represents a desired analogue output signal;

a feedback input for receiving a feedback signal representing an actual PWM output signal of the amplifier;

feedback loop filter for generating a filtered error signal comprising a filtered representation of differences between the input signal and the feedback signal;

a comparator for comparing the filtered error signal with a reference to generate a provisional PWM switching control signal for controlling the PWM amplifier; and a pulse conditioner arranged to receive both the provisional PWM switching control signal and the PWM input signal for outputting to the amplifier a conditioned PWM switching control signal comprising the provisional PWM switching control signal modified in accordance with predetermined constraints in relation to the PWM input signal.

Optional and preferred features can be the same as set forth above.

The invention further provides an amplifier comprising at least one output switch device for reproducing in PWM form an amplified version of a PWM input signal, the amplifier including a feedback controller according to the invention as set forth above, the output switch device having a control input coupled to receive said conditioned switching control signal.

The output switch device may comprise a pair of transistors in push-pull configuration.

The amplifier may comprise a second output switch device and a second feedback controller, the output switch devices may being connected so that their four transistors are connectable to a load in an H-bridge configuration.

The controller may comprise an integrated circuit separate from the output switch device, or integrated with it.

The controller may comprise an integrated circuit including additional circuitry for generating said PWM input signal from coded digital data, for example audio data.

The invention yet further provides a method of controlling a PWM amplifier, the method comprising:

receiving a pulse width modulated (PWM) input signal whose duty cycle represents a desired analogue output signal;

receiving a feedback signal representing an actual PWM output signal of the amplifier;

generating a filtered error signal comprising a filtered representation of differences between the input signal and the feedback signal;

comparing the filtered error signal with a reference to generate a provisional PWM switching control signal for controlling the PWM amplifier; and outputting to the amplifier a conditioned PWM switching control signal comprising the provisional PWM switching signal modified in accordance with predetermined constraints in relation to the PWM input signal.

The constraints may be such as to inhibit a transition in the switching control signal under conditions defined by reference to past transitions in the PWM input signal Depending on the further evolution of the PWM input signal and the provisional switching control signal, the transition in said provisional switching control signal which is inhibited by said pulse conditioner may be either eliminated altogether in said conditioned control signal or reproduced subsequently in response to a transition in the input signal.

Said constraints may include a "single pulse" constraint whereby it is ensured that for every input pulse, there is only one output pulse.

Said constraints may further include a "missing pulse" constraint, the method generating additional pulses in the conditioned control signal in the event that an interval between pulses in the provisional control signal exceeds a predetermined value.

The missing pulse function may be applied after the single pulse function.

Said constraints may further include a "minimum pulse" constraint imposing a minimum duration on pulses in the conditioned control signal.

The minimum pulse constraint may be applied after the single pulse function, and optionally after the missing pulse function also.

The names given to the three constraints mentioned above are not to be taken as limiting the scope of protection beyond the properties specifically ascribed to those constraints.

The invention yet further provides an amplifying method using at least one output switch device to reproduce in PWM form an amplified version of a PWM input signal, the method including a control method according to the invention as set forth above, the output switch device having a control input driven in accordance with said conditioned switching control signal.

The output switch device may comprise a pair of transistors in push-pull configuration.

The method may further comprise using a second output switch device and generating a second conditional switching control signal, the output switch devices being connected to drive a load in an H-bridge configuration.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Background

Figure 1:
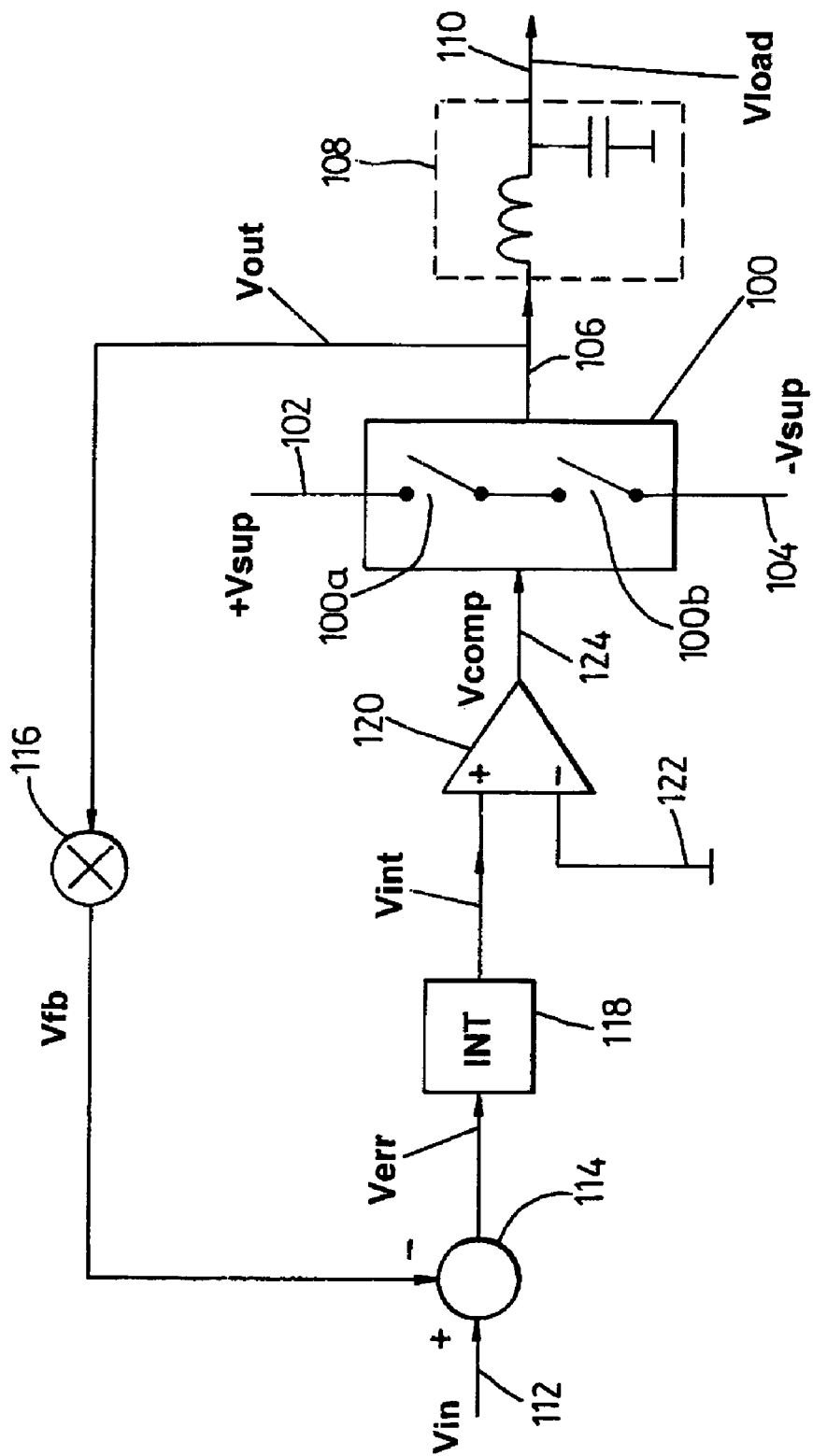
FIG. 1 is a block schematic diagram of a known PWM amplifier with feedback control.

FIG. 1 shows the overall architecture of a known PWM amplifier circuit with feedback control. The input is a PWM waveform Vin corresponding to a desired analogue audio signal. If the preceding PWM modulator is digital, Vin's edges will probably be quantised in time, aligned to some very high speed clock; if the preceding modulator is analogue, the edges will generally not be constrained to discrete time points.

The PWM amplifier comprises a power switch 100 comprising a pair of controllable switches 100a and 100b such as power MOSFETs coupled in a push-pull arrangement between positive and negative supply rails 102 (+Vsup) and 104 (−Vsup). The output 106 of the power switch is coupled through a low-pass output filter 108 to output terminal 110 which imposes a voltage waveform Vload on whatever load is to be driven. Input terminal 112 is connected to a positive input of a subtractor 114. Signal Vout from the output 106 or power switch 100 is also fed via an attenuator 116 to negative input of subtractor 114. The output of the subtractor is an error signal Verr, which is coupled through an integrator (low pass filter) 118 to give an integrated error signal Vint. The integrated error signal is fed to the positive (non-inverting) input of the comparator 120, whose inverting input is connected to a reference level at 122, for example, to ground. The output Vcomp 124 of the comparator is connected to the controlling input of power switch 100.

The function of the circuit is to control the switching of the MOSFETs 100a and 100b so that the filtered output Vload is an accurate representation of the input over the audio bandwidth. The circuit uses negative feedback so that any timing or amplitude errors in the switching stage are compensated. The loop filter 118 has a high gain over the audio band, so that errors are attenuated in the audio band.

With the increased emphasis on digital rather than analogue signal pre-processing, especially when the audio source is a digital format such as CDs or MP3 data, such a Class D power amplifier will preferably receive a digital PWM waveform generated by preceding digital circuitry from a PCM or other fixed-sample-rate single- or multi-bit source, and output a higher power output PWM waveform, which is then low-pass filtered by say a simple inductor-capacitor filter to drive a loudspeaker with a high quality audio waveform. Such an amplifier can be regarded as a high-power DAC with PWM digital input and PWM analogue output, in contrast to the alternative of a low-power PCM-to-analogue DAC followed by an analogue-input, PWM output PWM driver. The output levels will be centred on the desired reference level applied at 122. For simplicity, this level is assumed to be ground in the following description.

Figure 2:
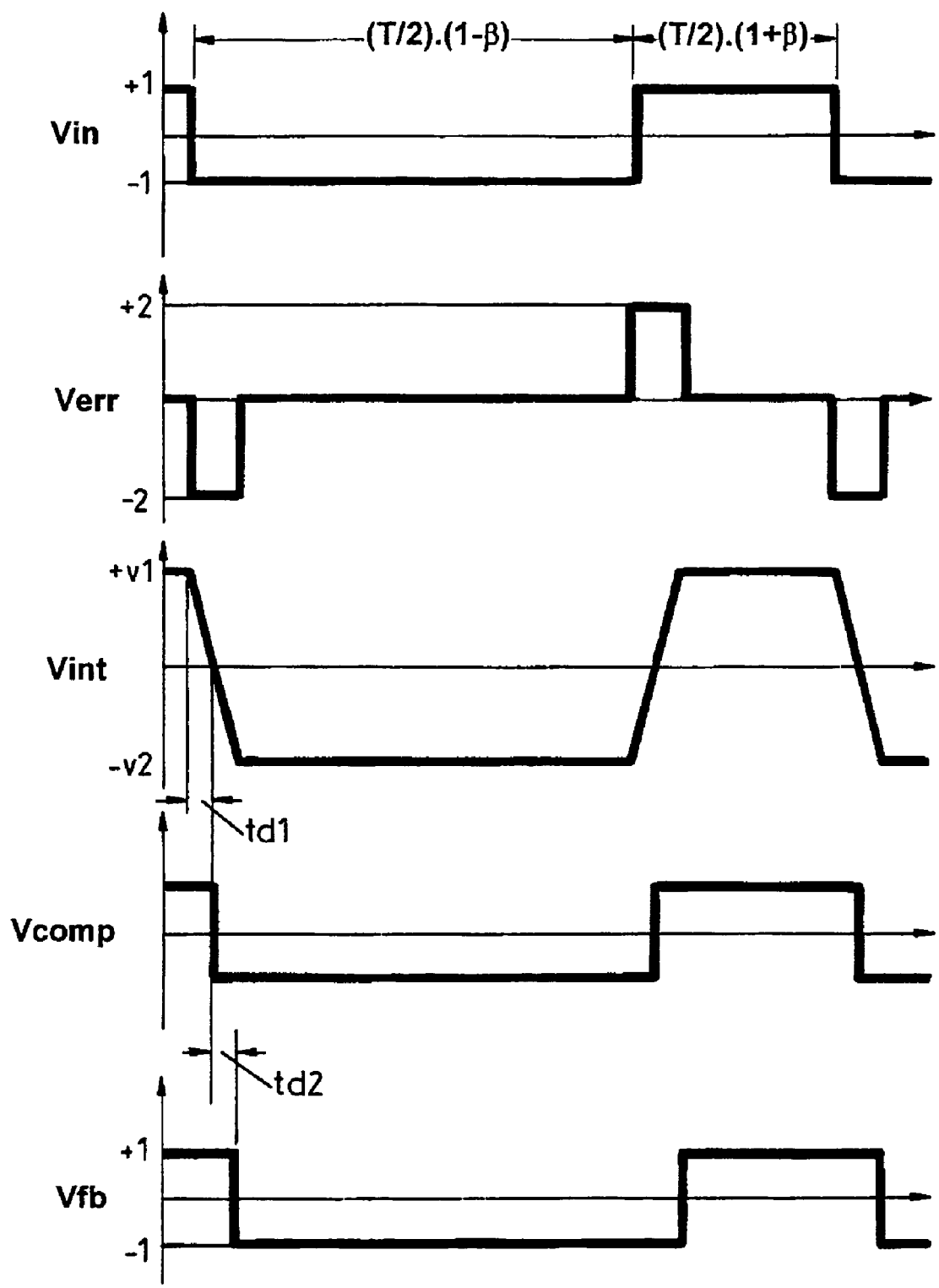
FIG. 2 shows waveforms within the circuit during ideal operation of the circuit of FIG. 1.

FIG. 2 shows this operation in more detail. For this explanation, we assume that the input data signal (Vin) is +1V when high, and −1V when low, and that the feedback attenuator value is such that peak signals at the output correspond to ±1V at Vfb under nominal supply voltage (Vfb is the post-attenuator feedback voltage). We further assume a resistive load and perfect (zero on-resistance) switches 100a and 100b. The input Vin is high for a duration (T/2) (1+β) and low for (T/2) (1−β), giving an expected average output voltage of β Vsup with −1<β<1. T is the period of the PWM wave form, the reciprocal of the pulse repetition frequency (PRF) which is typically a multiple of the audio sample frequency fs. For a sample rate of 44.1 kHz, the PWM frequency may be 352.8 kHz, for example. This multiple of 8 provides an increased bandwidth so that noise-shaping can be used to produce an output with an effective resolution of, for example 16-bits, but only requiring 8-bits of data. The effect of the noise-shaping can be observed as high frequency noise on the edges of the PWM waveform, similar in appearance to high-amplitude clock-jitter. This noise occurs outside the audio band and will be filtered by the smoothing filters, loudspeaker and even the listener's ear.

Initially, Vin is high, say, the output is high, and so the feedback signal Vfb is high. Under the assumption of an ideal circuit with supply voltage exactly correct, and no gain mismatch effects, the fed-back signal Vfb will be equal to Vin, so the error signal Verr will be zero and so the integrator output voltage Vint will be constant. Since the output voltage is high, we can deduce that the comparator output Vcomp is also high, and so Vint must be some positive voltage v1.

When Vin goes low, Vout and hence Vfb will initially still be high, so Verr will drop to −2V. This will cause Vint to ramp down at a rate $2/\tau$ where $\tau$ is the time constant of the integrator. After a delay $td1=v1\ \tau/2$, Vint will cross zero, causing Vcomp to go low. There will be some further delay td2 due to delays through the comparator and pre-driver before the output Vout switches. Only after this delay td2 will Vout and Vfb change polarity and error Verr return to zero. During this time Vint will ramp further negative to a voltage v2, where $v2=-td2\ (2/\tau)$.

Similar events happen at the next, positive, transition of Vin. Assuming the comparator and switch delays are equal there will be the same delays. By the symmetry of the operation, it can be seen that $|v1|=|v2|$, so $td1=td2$ and so the total delay between Vin changing and Vout responding is 2.td2 in each case. Thus the output waveform will be exactly the same as the input Vin, except for a constant delay 2.td2, and the expected gain factor between the amplitude of Vin and the amplitude of the high-voltage output swing (assumed to be Vsup), equal to the attenuation between Vout and Vfb.

In this ideal system, the duty-cycle of the input will be the same as the output, so the maximum duty cycle of the output will equal that of the output. This is normally desirable, so that the full range of input and output duty-cycle can be used.

However in practice there will be variations in the input amplitudes and output power supply voltage Vsup due to both manufacturing tolerances and operational effects such as supply ripple. Effects such as the on-resistance of the output switches will also alter the effective Vsup and there will be a manufacturing tolerance in the value of the feedback attenuation.

Figure 3A:
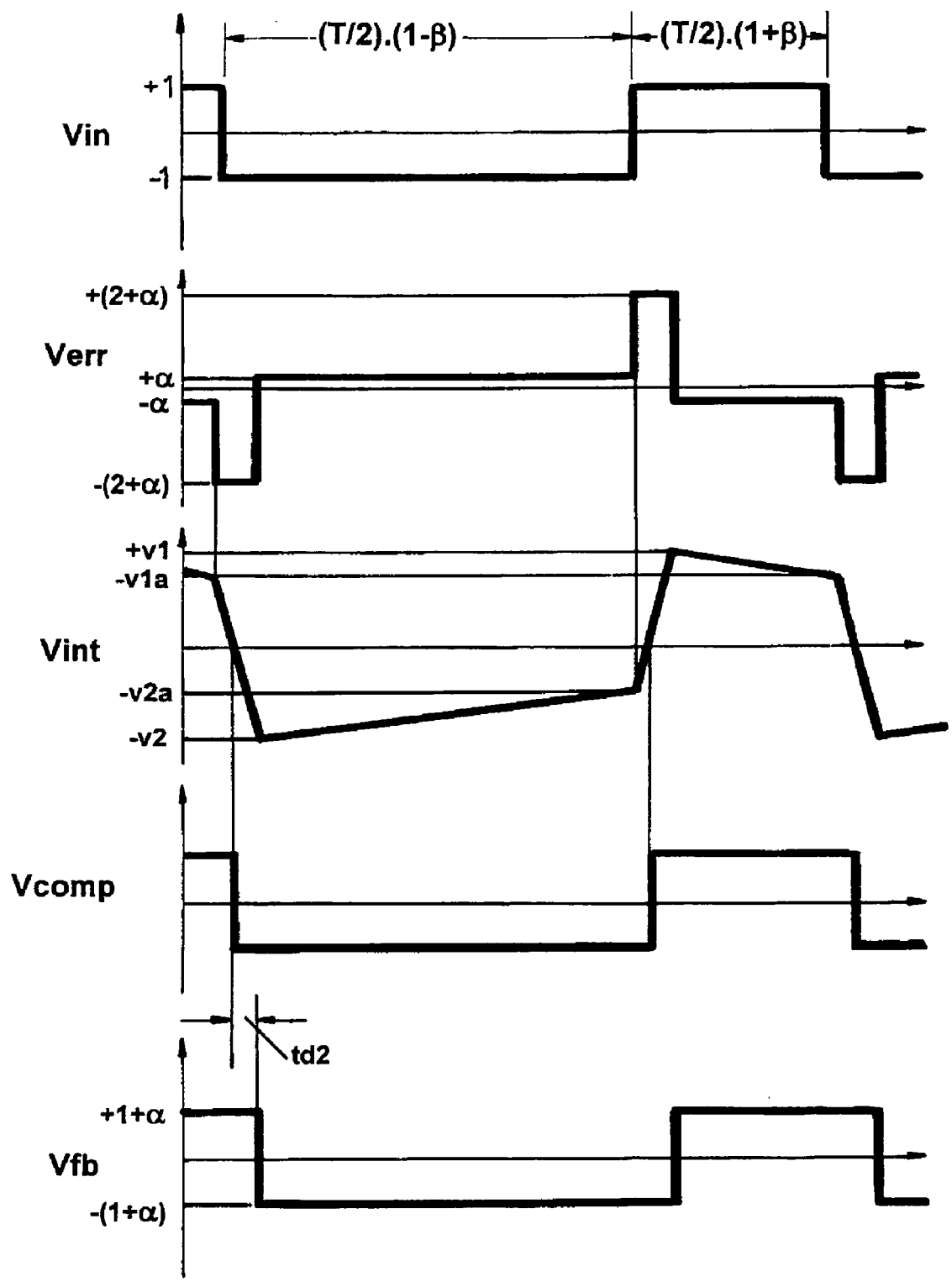
FIGS. 3a, 3b and 3c show waveforms in the circuit of FIG. 1 during increasingly non-ideal conditions.

FIG. 3a shows the effect of a small increase in the high-voltage supply, or any other effect, such as resistor tolerances in the attenuator, which increases Vfb so its swing is increased from +/−1 to a greater value $+/-(1+\alpha)$.

Starting at the instant when Vin goes negative, the error voltage (Vin−Vfb) will become $\{-1V-(-(1+\alpha))\}=-(2+\alpha)$, so Vint will tamp negative from some initial voltage v1a for a time td1' at a slew rate of $-(2+\alpha)/\tau$. After Vint crossing zero, going negative, there will again be a delay of td2 until Vout responds.

Even after Vfb changes polarity, there will still be an error voltage given by:

$$Verr=(Vin-Vfb)=-1-(-(1+\alpha))=\alpha$$

This will cause Vint to tamp positive at a slew rate $\alpha/\tau$ for the rest of the part cycle, that is for a time $\{(T/2).(1-\beta)-(td1'+td2)\}$ After Vin changes polarity, Vint now only has to Tamp from v2a rather than v2, so will cross zero sooner than in FIG. 2a, causing Vout to switch positive sooner. Similarly for the opposite case, the negative transition will also occur sooner than before, because of the droop from v1 to v1a. For a 50% duty cycle (zero audio signal) both effects will be symmetrical so the output will again be just a delayed version of the input. For the case shown, (where β and the audio signal <0), v2a will decrease in magnitude from v2 by more than v1a will droop below v1 (same slope α but longer duration), so the positive transition will be relatively earlier than the negative one. This will give a lengthened positive output pulse, producing a less negative output signal. If the positive gain error α is due to an increased Vsup or less-than-expected switch on-resistance, the altered duty cycle will tend to cancel the resulting average gain error.

Figure 3B:
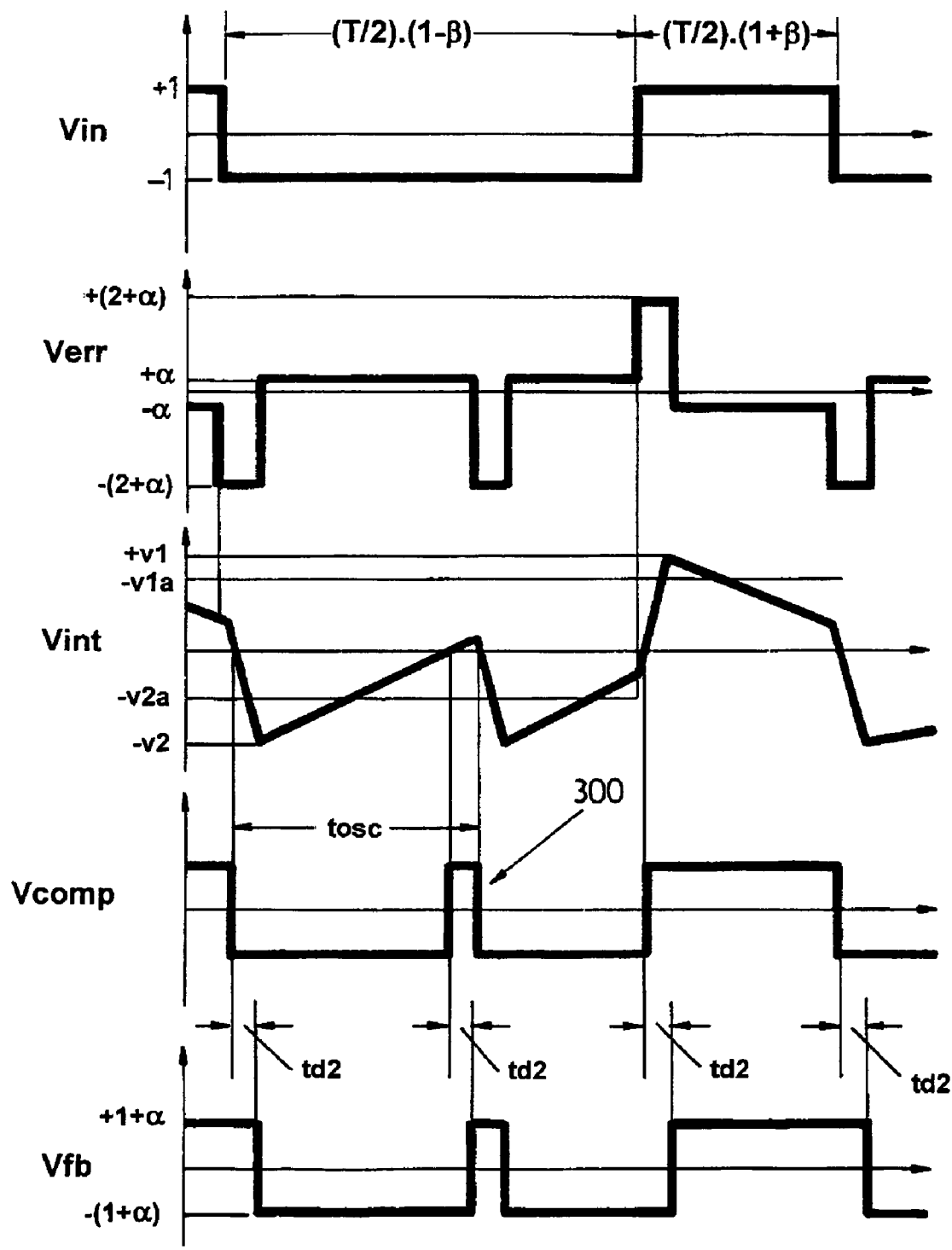
Figure 3C:
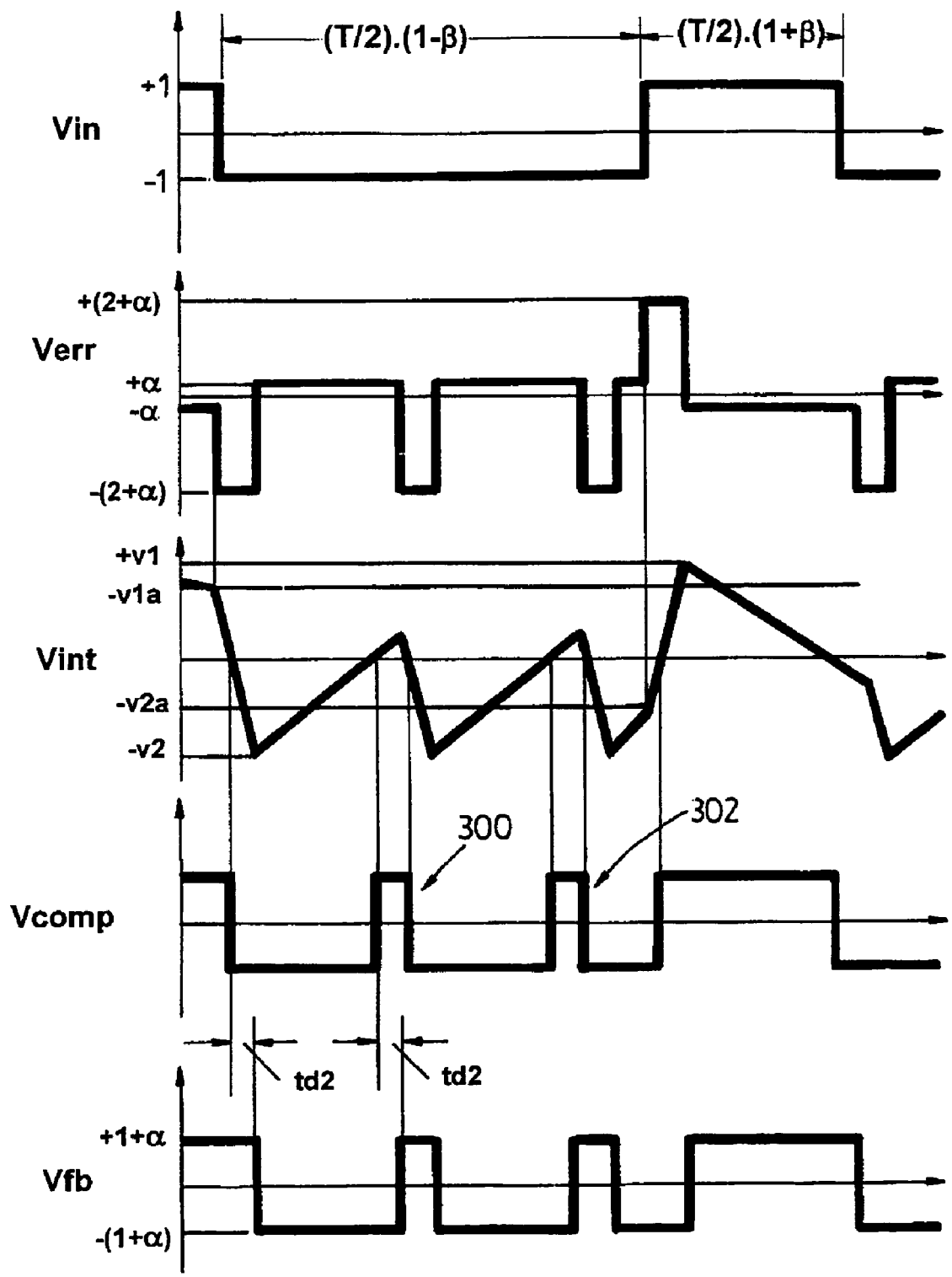

Referring now to FIG. 3b, we see that, if α increases, the error in Vfb and the resulting slope of Vint may become so large that Vint crosses zero before Vin changes. This will give an extra positive pulse 300 at Vcomp which will propagate to the output Vout and thence to Vfb. If α increases further, multiple pulses 300, 302 may occur within the cycle as shown in FIG. 3c.

The oscillation period of these extra pulses consists of i) an initial delay td2 until the output switches negative, during which Vint drops at a slew rate of $2+\alpha$ to a voltage $v2=td2*(2+\alpha)$ ii) a ramp back up to zero at a slew rate of α, taking a duration of $v2/\alpha=td2*(2+\alpha)/\alpha$ iii) another delay of td2 until the output switches positive, at a slew rate of α to reach a voltage $v3=td2*\alpha$ iv) a ramp back to zero from v3 at a slew rate of $2+\alpha$ taking a duration of $v3/\alpha=td2*\alpha/(2+\alpha)$ giving a total natural oscillation period of $$tosc=td2\{1+(2+\alpha)/\alpha+1+\alpha/(2+\alpha)\}$$

Assuming $\alpha<<2+\alpha$, $$Tosc=td2(2+(2+\alpha)/\alpha)=td2(3+(2/\alpha))$$

If td2=0.01*T, Tosc=T when $$T=0.01*T*(3+2/\alpha) \text{ or when } \alpha/2/97$$

Thus even a 2% increase in supply voltage above nominal may cause oscillations with an input duty cycle near 100% (or 0%)

Pulse-Constraint Circuit

Figure 4:
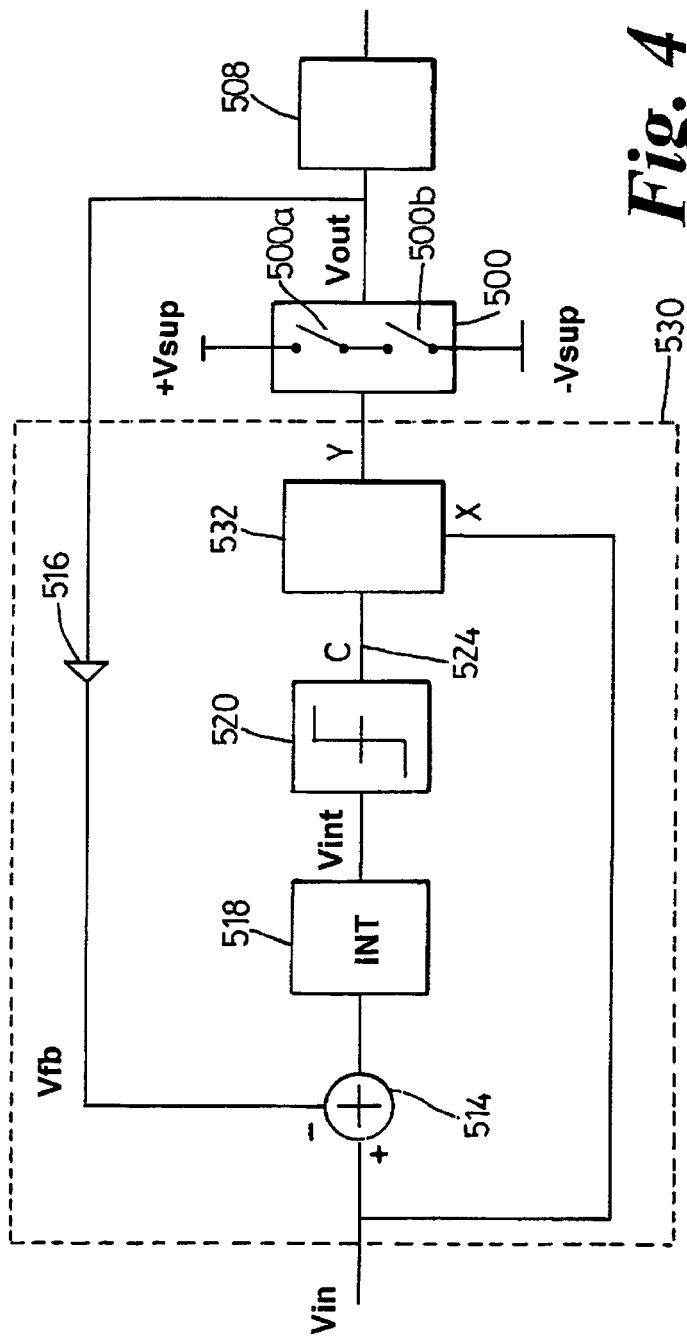
FIG. 4 is a block schematic diagram of a PWM amplifier including a novel feedback controller in accordance with one embodiment of the present invention.

FIG. 4 shows a modified PWM amplifier circuit, in which components 500 etc correspond to the like-numbered components 100 etc of the known circuit shown in FIG. 1. The parts enclosed by broken outline 530 may be regarded as the feedback controller for the amplifier and may well be provided in an integrated circuit package separate from the power switch 500. The feedback controller can be integrated on a common substrate with an audio codec, control logic and the like. The attenuator 516 (or part of it) may be off-chip, depending whether the necessary level of attenuation is known in advance, and whether some attenuation is necessary to avoid exceeding the maximum voltage permissible on the integrated circuitry. The attenuation and other parameters of the circuit may of course be made programmable.

Figure 5:
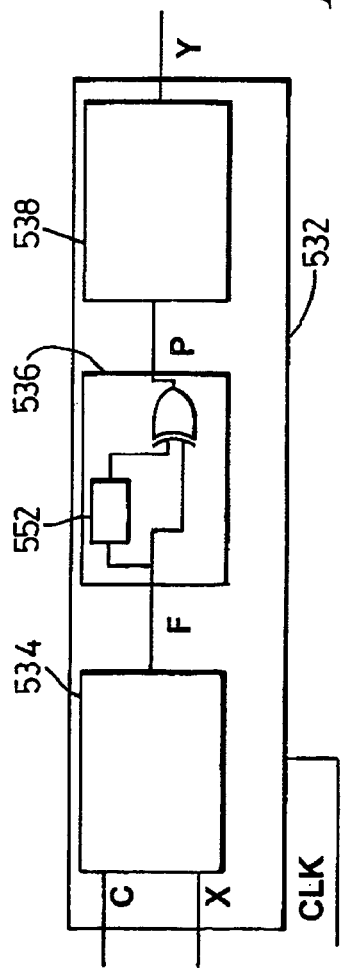
FIG. 5 shows three functions within a pulse-constraint logic within the controller of FIG. 4.

It will be seen that the novel controller 530 is identical to that in the known amplifier, but with the addition of pulse-constraint logic, circuit 532 interposed between the output 524 of comparator 520 and the controlling input of power switch 500. The pulse-constraint logic circuit is effectively a pulse conditioner which in this example implements three functions as seen schematically in FIG. 5:

Single-pulse function 534, to ensure that there is no more than one pulse generated per PWM period, and hence remove oscillations on the output of the comparator.

Missing-pulse function 536, to ensure that under overload conditions, a pulse is produced every period, so as to ensure the repetition rate of the output is kept constant., A minimum-pulse function 538, to limit the minimum high and low pulse-widths, so as to relax switching-speed constraints on the driver output stages.

Note that the missing and minimum pulse functions may be combined in a real implementation.

For reference in the following description and drawings, inputs and outputs of functions within logic circuit 532 are labelled C, X, F, P and Y as shown. The pulse-constraint circuit 532 accepts the comparator output Vcomp at its input C, and the input signal Vin at X, which provides a reference for the single-pulse function. A clock input CLK is fed with a clock in the order of 100 MHz, and is used for counter functionality. Such a clock is likely to be available from the previous digital audio processing stages. It will be seen that the signal path in normal operation is asynchronous from input to output, to ensure that fine (sub-nanosecond) timing on the C-input is preserved.

Single-Pulse Function

Figure 6A:
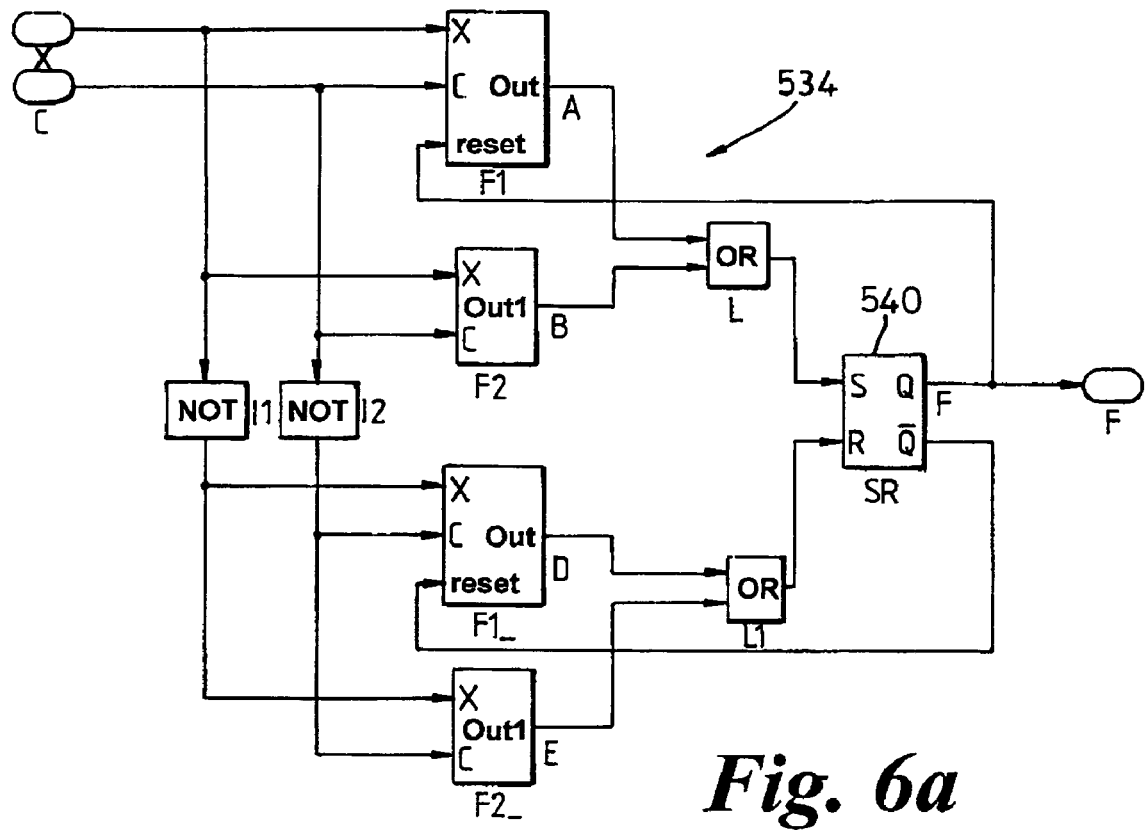
FIGS. 6a to 6c show in more detail logic circuitry implementing a single-pulse function within the circuit of FIG. 4.
Figure 6B:
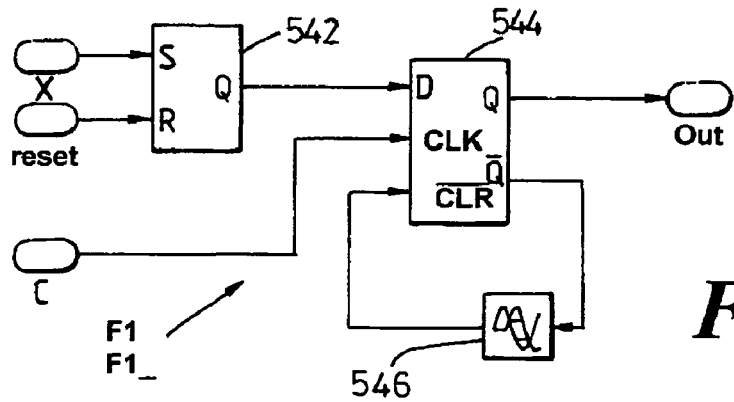
Figure 6C:
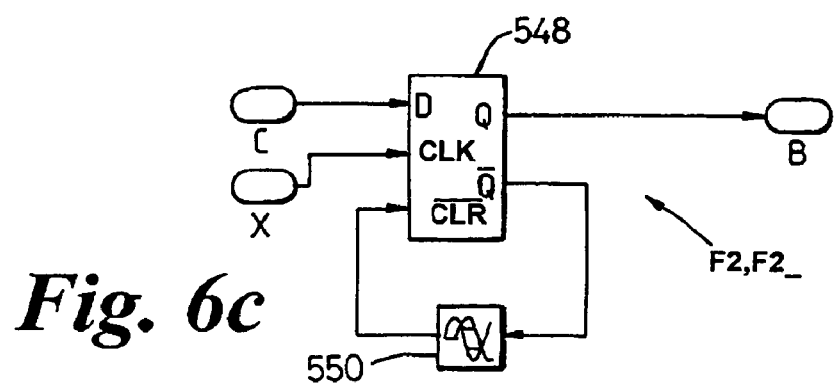

The single-pulse function 534 is implemented, in this example, by the circuit shown in FIGS. 6a-6c. Various functional logic circuits F1, F1_, F2, F2_ are provided, along with some logic gates (OR, NOT) and an SR flip-flop 540. The circuit operates by enforcing the following conditions:

1. The must be no more than one output pulse per period of the input signal X.
2. Each output pulse must start on or after the rising edge of X.
3. Each output pulse must end on or after the falling edge of X.

These constraints are relaxed enough to ensure that the modulator can still code this input signal correctly, that is without introducing timing changes that would interfere with the amplifier performance.

Figure 7:
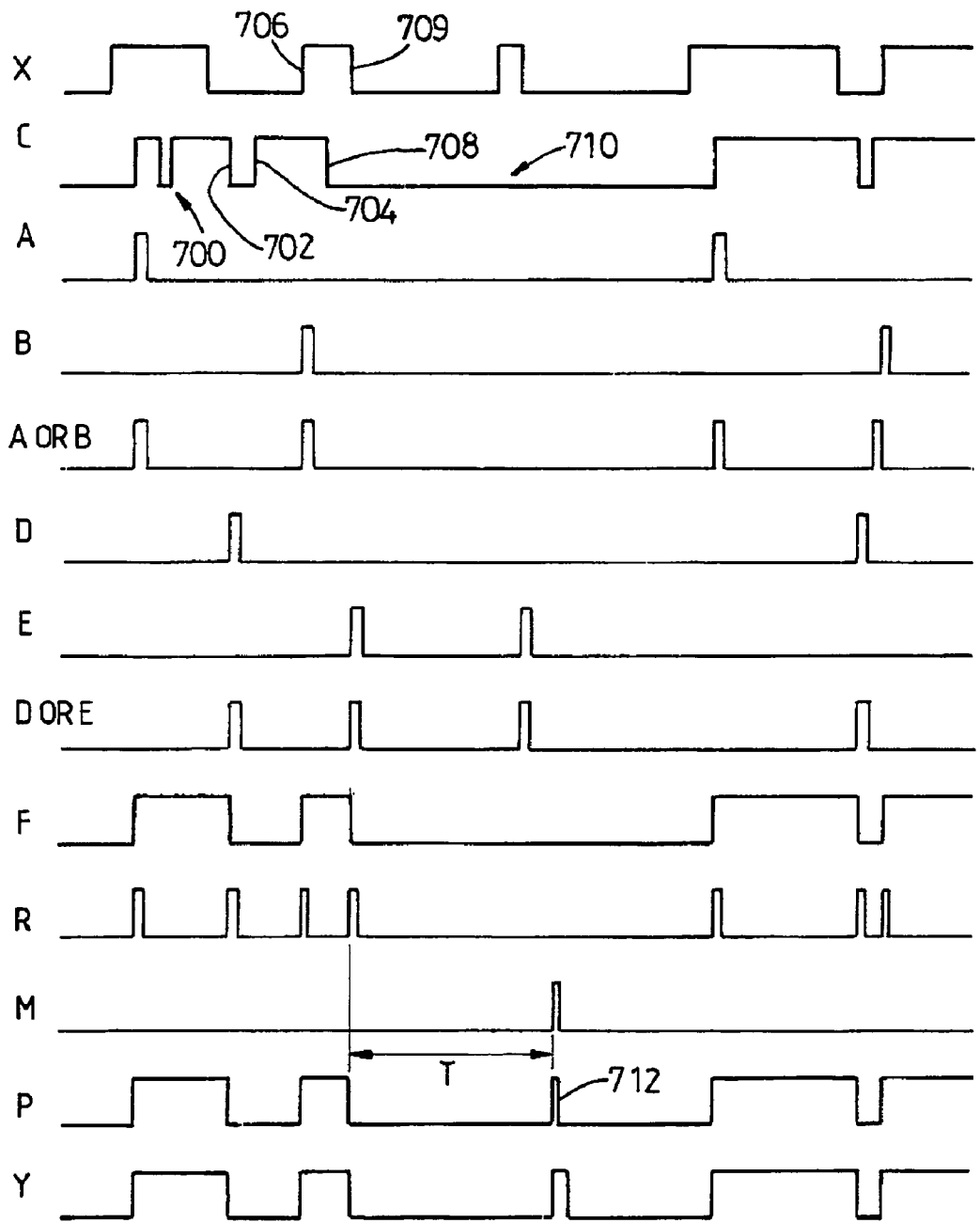
FIG. 7 shows waveforms illustrating the response of various parts of the pulse-constraint logic to various situations that may arise in the operation of the novel controlled.

The operation of the circuit 534 can be understood by reference to the waveforms of FIG. 7 where C corresponds to the provisional control signal, X corresponds to the PWM input signal Vin, and F is a conditioned control signal output from the circuit 534.

Functional logic F1 produces a single narrow pulse (waveform A) when C goes high after every rising edge of X. Function F2 produces a single narrow pulse (waveform B) if C is already high on the rising edge of X. Signals A and B are OR-ed together to produce a signal which sets the output of the SR flip-flop 540.

Conversely, for falling edges, function F1_ produces a single pulse (waveform D) when C goes low after every falling edge of X. Function F2_ produces a single pulse (waveform E) if C is already low on the falling edge of X. Signals D and E are ORed together to produce a signal which resets the output of the SR flip-flop 540.

FIG. 6b and FIG. 6c show possible implementations of F1 and F2 (F1_ is identical to F1 and F2_ is identical to F2). Function F1 (FIG. 6b) includes an SR flip-flop 542 which is rising edge triggered, a D-type flip-flop 544 and a delay circuit 546, all connected as shown Circuit 546 feeds back the negative output of the D-type flip-flop to an inverting clear input, with a delay equal to two periods of the clock CLK. The delay can be implemented by further flip-flops for example. Function F2 (FIG. 6c) is implemented by a D-type flip-flop 548, again having its output fed back via a delay circuit 550, also of two clock periods. Note that F1 and F1_ require a reset pulses for the input latch. These are fed back from the SR flip-flop at the output. This ensures that, if C has been low for more than a single period of the PWM waveform (T), the output will begin tracking C again immediately upon its transition. This is necessary to ensure stability.

Various features can be noted in the waveforms of FIG. 7. Low pulse 700 in the comparator output waveform C (Vcomp in the waveforms of FIGS. 3a to 3c) does not correspond to any real low pulse in the PWM input waveform X (Vin). The input wave forms X and C shown in FIG. 7 are arbitrary test waveforms created to illustrate various parts of the circuit operation and not real waveforms as seen in normal operation. However, it may be envisaged that the false pulse 700 corresponds to the false pulses 300 and 302 shown in FIGS. 3b and 3c and it will further be seen that, the false pulse 700 is not replicated in the output waveform F of the single pulse function 534. Nevertheless, after the input waveform X has returned to a low value, output waveform F immediately follows the next falling edge 702 of waveform C. Waveform C then rises again at 704, which is before there has been any further rise in input waveform X. Edge 704 is therefore not replicated in waveform F until input waveform X goes high at 706. Thereafter, waveform F only replicates the next falling edge 708 of waveform C after the next falling edge 709 in input waveform X.

Figure 8:
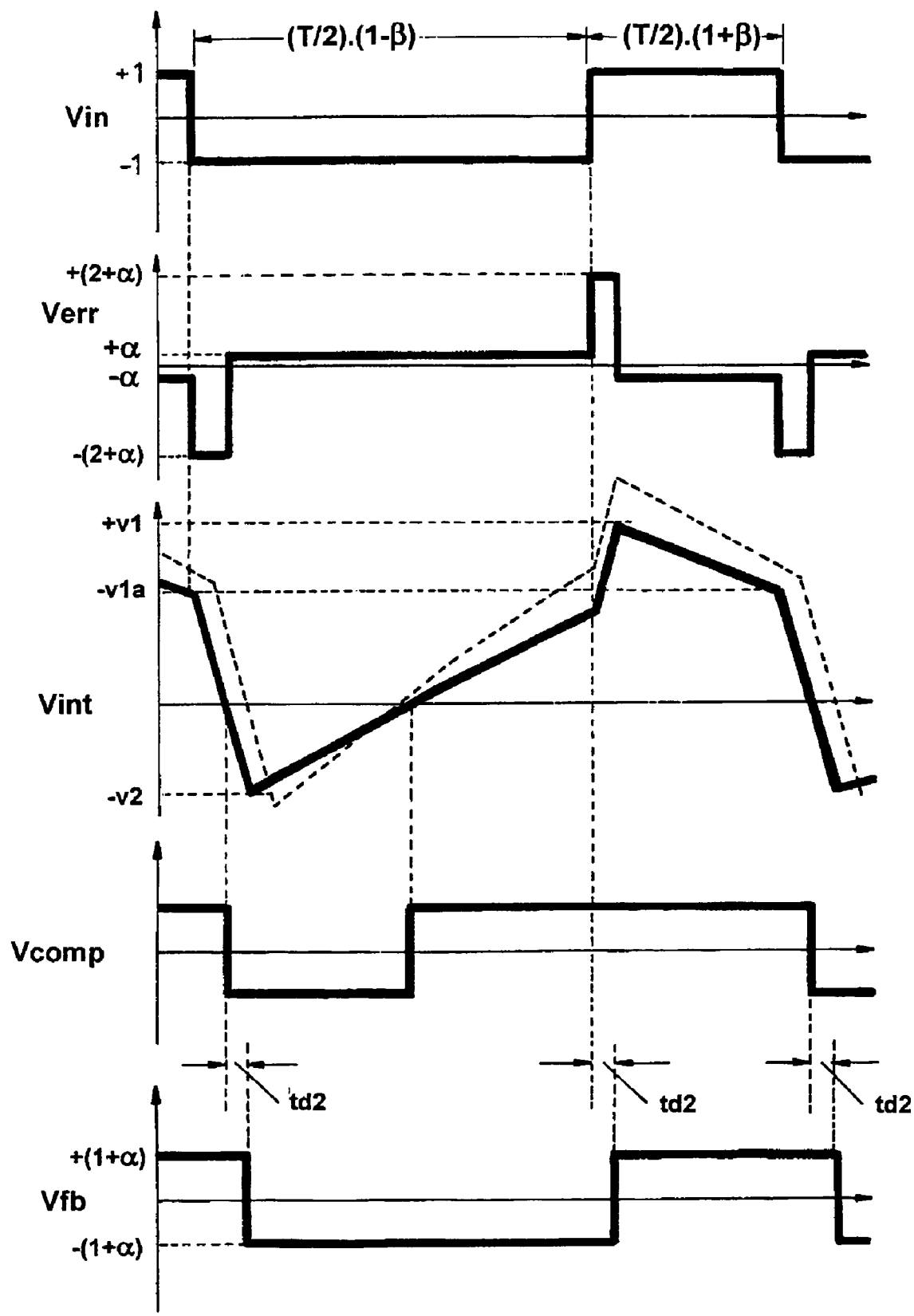
FIG. 8 shows waveforms in the novel circuit under non-ideal conditions, for comparison with the waveforms of FIGS. 3b and 3c.

It is noted again, that in each case, the response to edges in signal C is asynchronous (not delayed until the next transition in clock signal CLK) and waveform F will therefore faithfully replicate waveform C in normal operation. The single pulse function 534 only interferes to impose constraints upon waveform F, by reference to input waveform X, in circumstances where errors arise in the comparator output for reasons illustrated in FIGS. 3b and 3c. The circuit is designed so that transitions passing through the upper and lower paths are subject to substantially equal delays FIG. 8 shows the effect of this circuit on the operation of the loop. As before, starting from when Vin crosses zero going negative, Vint slews negative at a rate 2+α for a time td2 before the output switches. Vint then slews positively at a rate α. When it crosses zero, the comparator output Vcomp switches, but this transition is prevented from propagating to Vout and Vfb by the "Single-pulse" function. So Vint continues ramping positive. When Vin goes positive, the single-pulse function allows the comparator output to propagate to the output: assuming this propagation takes the same delay td2, Vint will ramp positive at a rate 2+α for a time td2 before the output switches and Vfb and Verr change sign. Vint then ramps negative at a rate α until Vin switches negative, after which it ramps negative at the faster rate of 2+α towards zero, where the cycle repeats.

The dotted curve illustrates what happens to Vint for a larger value of α. The cycle starts at a slightly lower value of v2 (=−td2(2+α)), with subsequent waveform similar to before but with larger slopes and overshooting positive by a greater amount. This delays the negative-going zero-crossing of Vint more, thus delaying the negative-going edge of Vout and Vfb by more, causing the reduction in duty-cycle at Vout necessary to correct the average output voltage for a change in Vsup, say, as before.

Missing-Pulse Function 536

The example waveforms of FIG. 7 show that the output signal F can be high or low for more than one pulse period, as for example at 710, where for some reason input C remains low even though X has pulse high. This may even be a consequence of the single pulse function 534, for example after a sudden change in duty-cycle. This can be problematic as it implies a lower pulse repetition frequency (PRF), which would increase the ripple-current in the output stage and potentially cause EMI problems.

The missing pulse function 536 can be implemented by a simple counter circuit (552 in FIG. 5) which is reset on every rising or falling edge of F. If the counter reaches time (T−1), where T is the pulse-period, a single clock period pulse is produced (signal M). This is XORed with F to produce signal P, where a narrow pulse 712 can be seen.

Note that the missing pulse function could be implemented by a monostable multi-vibrator, if a suitable clock signal CLK were not available. This might be the case where the PWM waveform is generated directly from an analogue input signal.

Minimum-Pulse Function 538

The minimum pulse-function is designed to ensure that the minimum high or low pulse is limited, so as to relax the switching speed requirements of the output stage. For example, in FIG. 7 the narrow pulse 712 in signal P is widened in the output Y.

Figure 9:
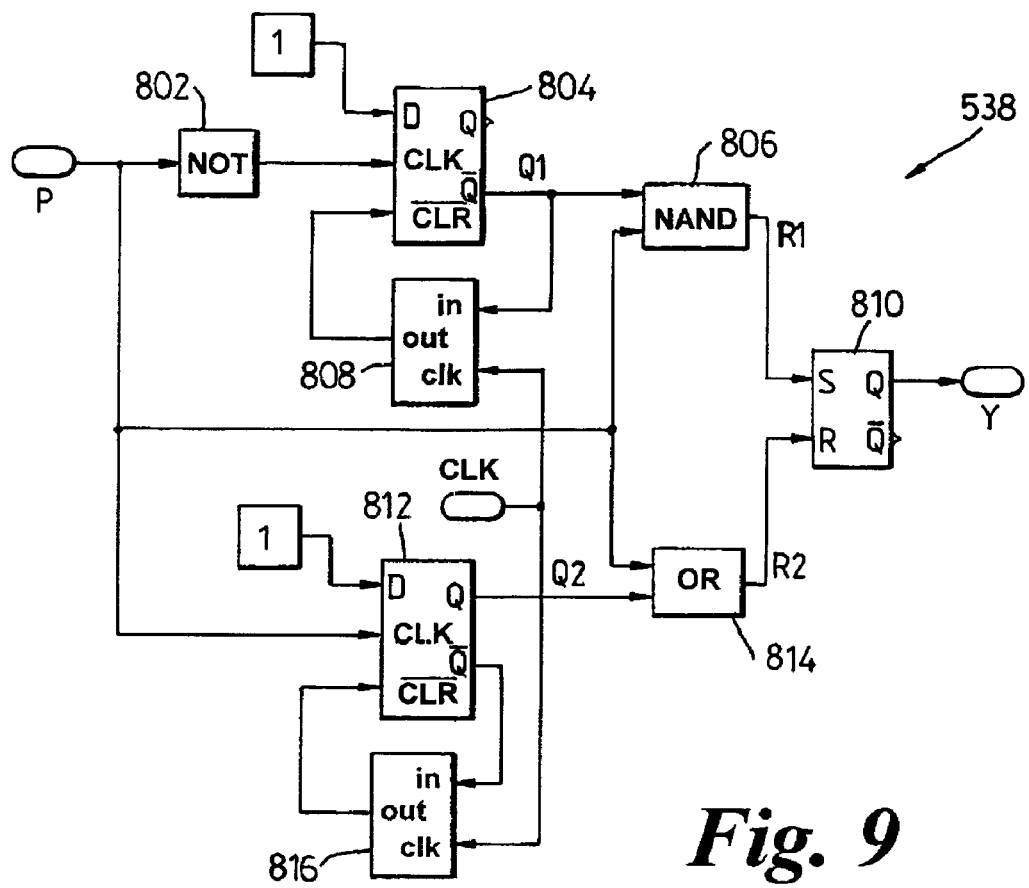
FIG. 9 shows in more detail logic circuitry implementing a minimum-pulse function within the novel controller.

FIG. 9 shows one possible implementation of the minimum pulse circuit, comprising two branches. In the upper branch, signal P is inverted at 802 and then fed to the clock input of a D-type flip-flop 804 whose data input is tied to logic '1'. The inverted output of flip-flop 804 is fed to a first input of a NAND gate 806. The inverted output of flip-flop 804 is also fed back to an inverted clear input via delay circuit 808 driven by clock signal CLK. The second input of NAND gate 806 is fed directly by signal P. The output of gate 806, which is the output of the upper branch of the circuit, drives the set input of a falling edge-triggered SR flip-flop 810, whose output is the output signal Y. The lower branch of the circuit is similar in structure, comprising D-type flip-flop 812, OR gate 814 and delay 816. Lower branch of flip-flop 812 receives signal P directly, rather than through an inverter, and OR gate 814 receives signal P and the non-inverted output of flip-flop 810.

Figure 10:
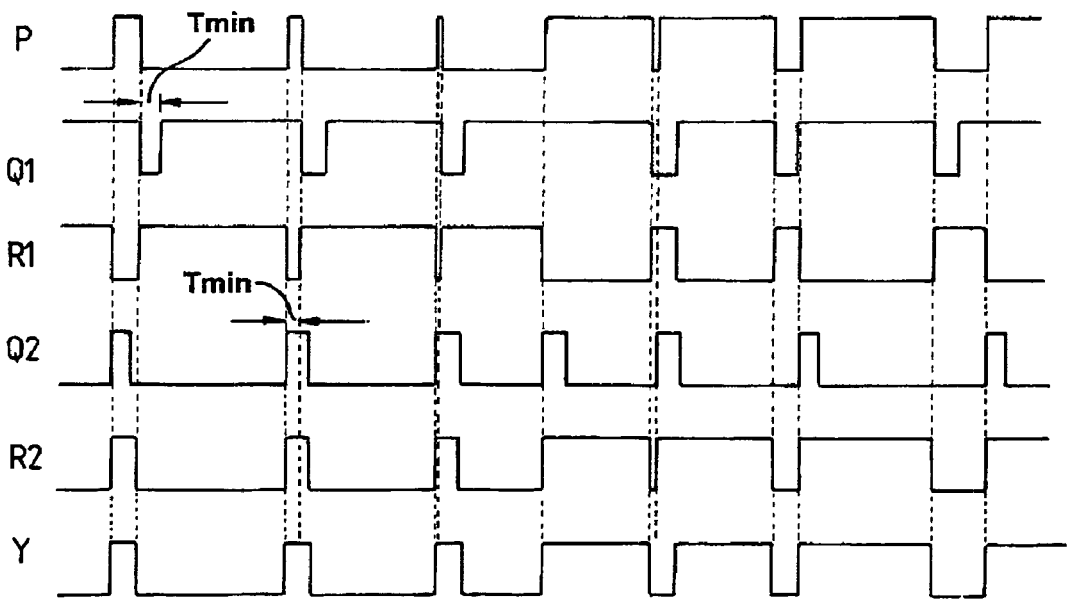
FIG. 10 shows waveforms illustrating the response of various parts within the minimum-pulse function.

The operation of the circuit can be understood by reference to the waveforms of FIG. 10, where P is the input and Y is the output, and Tmin is the minimum pulse-width. The upper branch of the circuit (802-808) implements a limit on the minimum low-pulse, by delaying the rising edge of the output. The lower branch (812-816) implements a limit on the minimum high-pulse, by delaying the falling edge of the output. Considering the lower branch, the flip-flop output goes high on the rising edge of P for a period given by the length of the delay feeding the clear input. Thus delay circuit 816 sets the minimum pulse-width. The flip-flop output is ORed with P, having the effect of extending high pulses that are shorter than the minimum pulse-width. The upper branch has similar functionality operating on low pulses.

Note that the minimum pulse-width circuit will enlarge original pulses which have less than a minimum width, as well as the narrow pulses, if any, generated by the missing pulse circuit 536. A minimum pulse width function is known in the art and is desirable in order to ensure that the transistors in power switch 500 have time to turn fully on or fully off.

Filter Implementation

Figure 11:
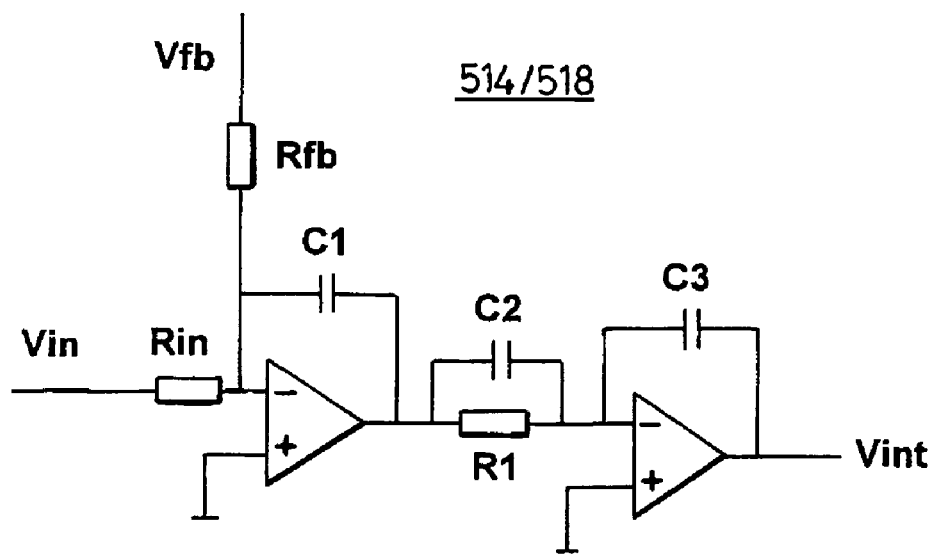
FIGS. 11 and 12 illustrate two possible filter circuits for use within the feedback controller of FIGS. 4 to 9.
Figure 12:
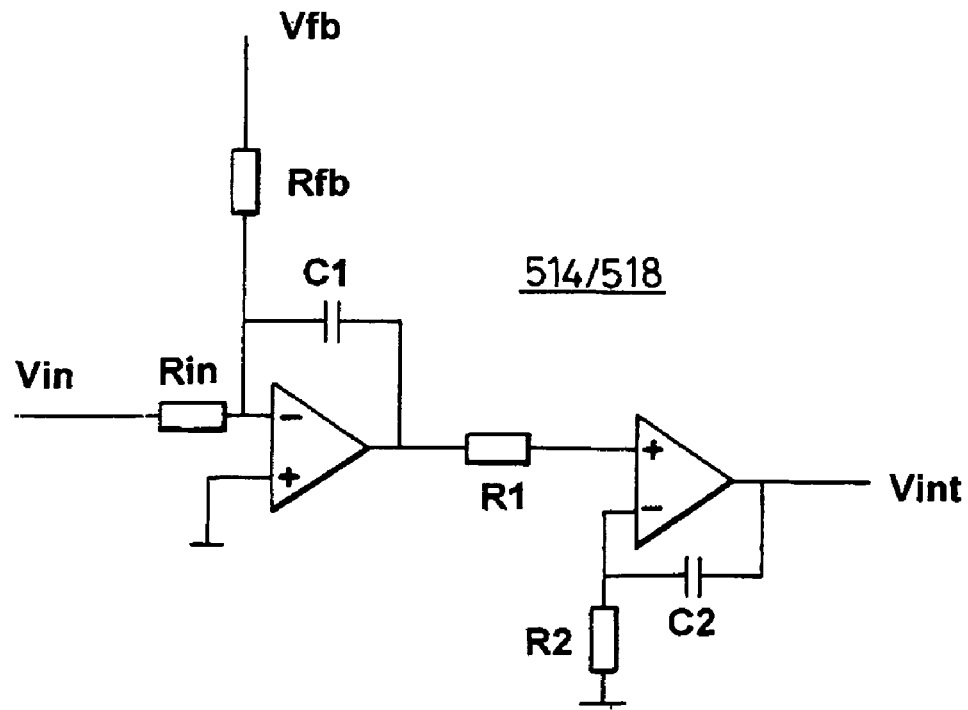

The above description of operation assumed that the loop filter 518 was a simple integrator. However higher-order filters can be used to improve performance and relax constraints on the pulse frequency 518. Two alternative loop-filter implementations are shown in FIG. 11 and 12 The first op-amp in each circuit also serves as the input summer 514 in FIG. 4. Both filters are second-order and have an additional zero for stability. Note the component values are different in each case. The filter of FIG. 12 has an overall inversion, and so the +/− comparator inputs are swapped to compensate.

Other Modifications

The above and many other modifications can be made within the spirit and scope of the invention. While various detailed implementations of various functions have been shown, for the sake of illustration and explanation, the invention is not limited to these implementations, not to the application of digital audio amplification.

For instance, similar circuitry could be used to drive other transducers, for example sonar transducers or electromechanical transducers such as voice-coil mechanisms in disc drives. The avoidance of spurious tones at unpredictable frequencies could be important in electromechanical transducers other than loudspeakers, as such tones might increase the perception of noise and/or excite undesirable mechanical resonances.

The embodiment uses low-pass filters as the loop filter. The loop filter needs to have high gain across the frequency band of interest, over which low distortion and flat overall system frequency response is required, and lower gain at other frequencies where the PWM quantisation noise will reside. It could be possible to use other filters, for example a band-pass filter for say communications or other applications where the output band of interest is a narrow-band centred round some frequency. Normal loop stability analysis would be necessary to ensure loop stability.

Figure 13:
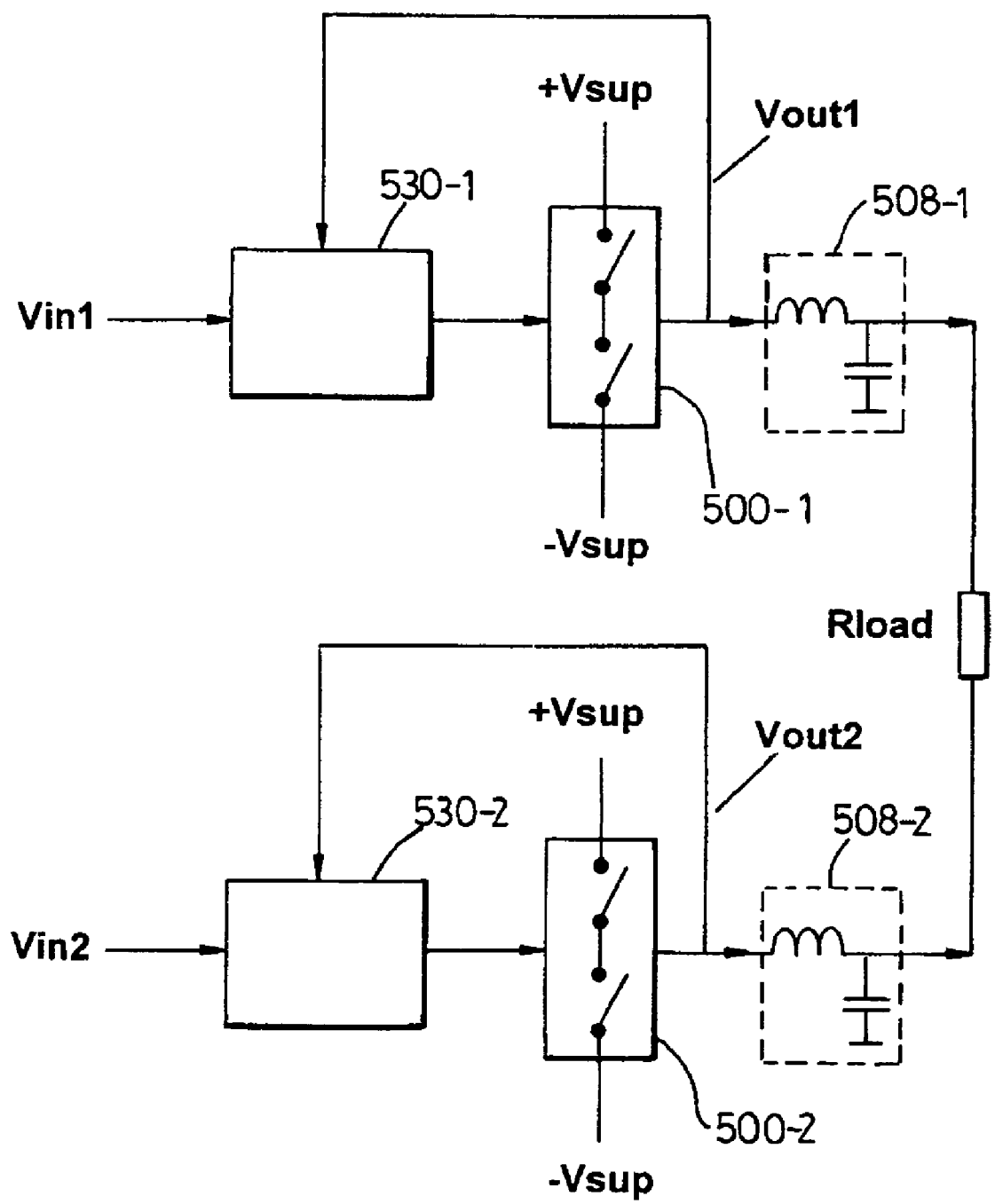
FIG. 13 illustrates two power switches and two feedback controllers driving a load in an H-bridge configuration.

The embodiment of FIGS. 5 to 12 uses a simple two-transistor push-pull stage to provide a "single-ended" output. As shown in FIG. 13, the idea could be extended to H-bridge output stages, operating in two- or three- or four-state modes. In FIG. 13 there are shown two power switches 500-1 and 500-2, each similar in form to the switch 500 of FIG. 5. Each power switch has its own feedback controller 530-1/530-2, driven by respective PWM input signals Vin1 and Vin2 and feedback signals Vout1 and Vout2. A load resistance Rload is connected between the outputs of the power switches, via respective out filters 508-1/508-2.

The skilled person will appreciate the changes needed to the input signals to control the bridge amplifiers. In 2-level bridge mode, the input Vin2 is an inverted version of Vint. In 3-level (3 or 4-states), the signals Vin1 and Vin2 will come from two separate outputs of a tri-level modulator. Co-pending application GB0500902.2 "Pulse Width Modulator Quantisation Circuit" filed 17 Jan. 2005 (corresponding to U.S. Ser. No. 11/110,858 21 Apr. 2005 by Anthony Magrath) describes our preferred tri-level control circuitry, while other methods are known in the art.

The embodiments described use split output supplies +Vsup and −Vsup. The output stage could be driven from a single supply Vsup and ground, though in this case an additional bias signal would normally have to be added into the subtractor 514 to compensate for the difference in the average levels at Vin and Vfb when both are running at 50% duty cycle. A DC blocking capacitor can easily be provided between the output and the load, as appropriate.

The invention claimed is:

1. A feedback controller for a PWM amplifier, the controller comprising:
    a signal input for receiving a pulse width modulated (PWM) input signal whose duty cycle represents a desired analogue output signal;
    a feedback input for receiving a feedback signal representing an actual PWM output signal of the amplifier;

means for generating a filtered error signal comprising a filtered representation of differences between the input signal and the feedback signal;

means for comparing the filtered error signal with a reference to generate a provisional PWM switching control signal for controlling the PWM amplifier; and a pulse conditioner comprising a sequential logic circuit arranged to receive both the provisional PWM switching control signal and the PWM input signal for outputting to the amplifier a conditioned PWM switching control signal comprising the provisional PWM switching control signal modified so as to inhibit a transition in the switching control signal under conditions defined by reference to past transitions in the PWM input signal.

2. A feedback controller as claimed in claim 1 wherein, depending on the further evolution of the PWM input signal and the provisional switching control signal, the transition in said provisional switching control signal which is inhibited by said pulse conditioner will be either eliminated altogether in said conditioned control signal or reproduced subsequently in response to a transition in the input signal.

3. A feedback controller as claimed in claim 1 wherein the pulse conditioner implements a "single pulse" function whereby it is ensured that for every input pulse, there is no more than one output pulse.

4. A feedback controller as claimed in claim 1 wherein the logic circuit is constructed such that, subject to constraints based on the PWM input signal, the conditioned control signal responds asynchronously to transitions in the provisional control signal.

5. A feedback controller as claimed in claim 1, wherein the logic circuit further comprises a clock input for a clock signal having a frequency many times the pulse repetition frequency of said PWM input signal.

6. A feedback controller as claimed in claim 3 wherein the pulse conditioner is formed such that the conditioned PWM switching signal will be identical to the provisional PWM switching control signal for as long as supply voltages to the amplifier and modulation depth in the PWM input signal remain within predetermined operating limits.

7. A feedback controller as claimed in claim 3 wherein the pulse conditioner further comprises a "missing pulse" function for generating additional pulses in the conditioned control signal in the event that an interval between pulses in the conditioned control signal would exceed a predetermined value.

8. A feedback controller as claimed in claim 7 wherein the missing pulse function is applied after the single pulse function.

9. A feedback controller as claimed in claim 3 wherein the pulse conditioner further includes a "minimum pulse" function for imposing a minimum duration on pulses in the conditioned control signal.

10. A feedback controller as claimed in claim 9 wherein the minimum pulse function is applied after the single pulse function and after the missing pulse function, is present.

11. A feedback controller for a PWM amplifier, the controller comprising:

a signal input for receiving a pulse width modulated (PWM) input signal whose duty cycle represents a desired analogue output signal;

a feedback input for receiving a feedback signal representing an actual PWM output signal of the amplifier;

a feedback loop filter for generating a filtered error signal comprising a filtered representation of differences between the input signal and the feedback signal;

a comparator for comparing the filtered error signal with a reference to generate a provisional PWM switching control signal for controlling the PWM amplifier; and a pulse conditioner comprising a sequential logic circuit arranged to receive both the provisional PWM switching control signal and the PWM input signal for outputting to the amplifier a conditioned PWM switching control signal comprising the provisional PWM switching control signal modified to inhibit a transition in the switching control signal under conditions defined by reference to past transitions in the PWM input signal.

12. A feedback controller as claimed in claim 11 wherein, depending on the further evolution of the PWM input signal and the provisional switching control signal, the transition in said provisional switching control signal which is inhibited by said pulse conditioner will be either eliminated altogether in said conditioned control signal or reproduced subsequently in response to a transition in the input signal.

13. A feedback controller as claimed in claim 11, wherein the pulse conditioner implements a "single pulse" function whereby it is ensured that for every input pulse, there is no more than one output pulse.

14. A feedback controller as claimed in claim 11 wherein the logic circuit is constructed such that, subject to constraints based on the PWM input signal, the conditioned control signal responds asynchronously to transitions in the provisional control signal.

15. An amplifier comprising at least one output switch device for reproducing in PWM form an amplified version of a PWM input signal, the amplifier including a feedback controller according to claim 1, the output switch device having a control input coupled to receive said conditioned switching control signal.

16. An amplifier as claimed in claim 15 wherein the output switch device comprises a pair of transistors in push-pull configuration.

17. An amplifier as claimed in claim 16, further comprising a second output switch device and a second feedback controller, the output switch devices may being connected so that their four transistors are connectable to a load in an H-bridge configuration.

18. An amplifier as claimed in claim 15 wherein the controller comprises an integrated circuit separate from the output switch device.

19. An amplifier as claimed in claim 15 wherein the controller comprises an integrated circuit integrated with the output switch device.

20. An amplifier as claimed in claim 18 wherein said integrated circuit additionally includes circuitry for generating said PWM input signal from coded digital data.

21. A method of controlling a PWM amplifier, the method comprising:

receiving a pulse width modulated (PWM) input signal whose duty cycle represents a desired analogue output signal;

receiving a feedback signal representing an actual PWM output signal of the amplifier;

generating a filtered error signal comprising a filtered representation of differences between the input signal and the feedback signal;

comparing the filtered error signal with a reference to generate a provisional PWM switching control signal for controlling the PWM amplifier; and outputting to the amplifier a conditioned PWM switching control signal comprising the provisional PWM switching signal modified to inhibit a transition in the switching control signal under conditions defined by reference to past transitions in the PWM input signal.

22. A method as claimed in claim 21 wherein, depending on the further evolution of the PWM input signal and the provisional switching control signal, the transition in said provisional switching control signal which is inhibited by said pulse conditioner will be either eliminated altogether in said conditioned control signal or reproduced subsequently in response to a transition in the input signal.

23. A method as claimed in claim 21, wherein said constraint includes a "single pulse" constraint whereby it is ensured that for every input pulse, there is no more than one output pulse.

24. A method as claimed in claim 23 wherein a "missing pulse" constraint is further applied, the method generating additional pulses in the conditioned control signal in the event that an interval between pulses in the conditioned control signal would exceed a predetermined value.

25. A method as claimed in claim 24 wherein the missing pulse function is applied after the single pulse function.

26. A method as claimed in claim 23, wherein a "minimum pulse" constraint is further applied, imposing a minimum duration on pulses in the conditioned control signal.

27. A method as claimed in claim 26 wherein the minimum pulse constraint is applied after the single pulse function, and after the missing pulse function if present.

28. An amplifying method using at least one output switch device to reproduce in PWM form an amplified version of a PWM input signal, the method including a control method according to claim 22, the output switch device having a control input driven in accordance with said conditioned switching control signal.

29. A method as claimed in claim 28 wherein the output switch device comprises a pair of transistors in push-pull configuration.

30. A method as claimed in claim 29, further comprising using a second output switch device and generating a second conditional switching control signal by a method as claimed in claim 21, the output switch devices being connected to drive a load in an H-bridge configuration.

* * * * *